(12) United States Patent
Wang et al.

(10) Patent No.: US 6,723,624 B2
(45) Date of Patent: Apr. 20, 2004

(54) METHOD FOR FABRICATING N-TYPE CARBON NANOTUBE DEVICE

(75) Inventors: Hung-Hsiang Wang, Taipei (TW); Jeng-Hua Wei, Taipei (TW); Ming-Jer Kao, Tainan (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 0 days.

(21) Appl. No.: 10/369,540

(22) Filed: Feb. 21, 2003

(65) Prior Publication Data

US 2004/0023431 A1 Feb. 5, 2004

Related U.S. Application Data

(62) Division of application No. 10/233,601, filed on Sep. 4, 2002.

(30) Foreign Application Priority Data

Jul. 31, 2002 (TW) ........................................ 91117244 A

(51) Int. Cl.7 ............................................ H01L 21/3205
(52) U.S. Cl. ........................ 438/585; 438/99; 438/105; 438/197; 438/300
(58) Field of Search ........................ 438/99, 300, 197, 438/105, 585

(56) References Cited

U.S. PATENT DOCUMENTS

2003/0160235 A1 * 8/2003 Hirai ........................... 257/40

* cited by examiner

*Primary Examiner*—Jack Chen
(74) *Attorney, Agent, or Firm*—Bacon & Thomas

(57) ABSTRACT

A method for fabricating an n-type carbon nanotube device, characterized in that thermal annealing and plasma-enhanced chemical vapor-phased deposition (PECVD) are employed to form a non-oxide gate layer on a carbon nanotube device. Moreover, the inherently p-type carbon nanotube can be used to fabricate an n-type carbon nanotube device with reliable device characteristics and high manufacturing compatibility.

6 Claims, 6 Drawing Sheets

METHOD FOR FABRICATING N-TYPE CARBON NANOTUBE DEVICE

This application is a divisional application of pending U.S. application Ser. No. 10/233,601, filed Sep. 4, 2002 (of which the entire disclosure of the pending, prior application is hereby incorporated by reference).

BACKGROUND OF THE INVENTION

1. Field of the Invention

The present invention generally relates to a method for fabricating an n-type carbon nanotube device and, more particularly, to a method characterized in that thermal annealing and plasma-enhanced chemical vapor-phased deposition (PECVD) are employed to form a non-oxide gate layer on a carbon nanotube device. Therefore, the inherently p-type carbon nanotube can be used to fabricate an n-type carbon nanotube device with reliable device characteristics and high manufacturing compatibility.

2. Description of the Prior Art

In the nanotechnology era, it is an important issue to develop a carbon nanotube (CNT) logic device. Inherently, a carbon nanotube transistor exhibits p-type characteristics at room temperature.

Richard Smalley et al. have disclosed a conventional technique in "Chemical doping of individual semiconducting carbon-nanotube ropes" (Physical Review B, Vol.61, No. 16), in which potassium ions are implanted into the carbon nanotube so as to provide sufficient electrons such that the carbon nanotube exhibts n-type characteristics. However, this method is not compatible with the state-of-the-art semiconductor manufacturing process.

Therefore, there is need in providing a method for fabricating an n-type carbon nanotube device, in which the p-type carbon nanotube exhibits n-type characteristics at room temperature and the method is compatible with the state-of-the-art semiconductor manufacturing process.

SUMMARY OF THE INVENTION

Accordingly, it is the primary object of the present invention to provide a method for fabricating an n-type carbon nanotube device, characterized in that thermal annealing and plasma-enhanced chemical vapor-phased deposition (PECVD) are employed to form a non-oxide gate layer on a carbon nanotube device.

It is the secondary object of the present invention to provide a method for fabricating an n-type carbon nanotube device, characterized in that the inherently p-type carbon nanotube can be used to fabricate an n-type carbon nanotube device with reliable device characteristics and high manufacturing compatibility.

In order to achieve the foregoing objects, the present invention provides a method for fabricating an n-type carbon nanotube device, comprising steps of: depositing an oxide film on a substrate; forming a first metal film on said oxide film; forming a carbon nanotube layer on said first metal film; depositing a gate layer covering said first metal film and said carbon nanotube layer; and forming a gate electrode on said gate layer.

The present invention further provides another method for fabricating an n-type carbon nanotube device, comprising steps of: forming a gate electrode in a substrate; depositing an oxide film on said substrate and said gate electrode; forming a first metal film on said oxide film; depositing a carbon nanotube layer on said first metal film; and depositing a gate layer covering said first metal film and said carbon nanotube layer.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing a method for fabricating an n-type carbon nanotube device can be exemplified by the preferred embodiments as described hereinafter.

The method according to the present invention employs plasma-enhanced chemical vapor-phased deposition (PECVD) to form a non-oxide gate layer, such as silicon nitride (SiNx), on a carbon nanotube device to function as a gate oxide layer. Meanwhile, thermal annealing is performed to fabricate an n-type carbon nanotube device from a p-type carbon nanotube.

Figure 1A:
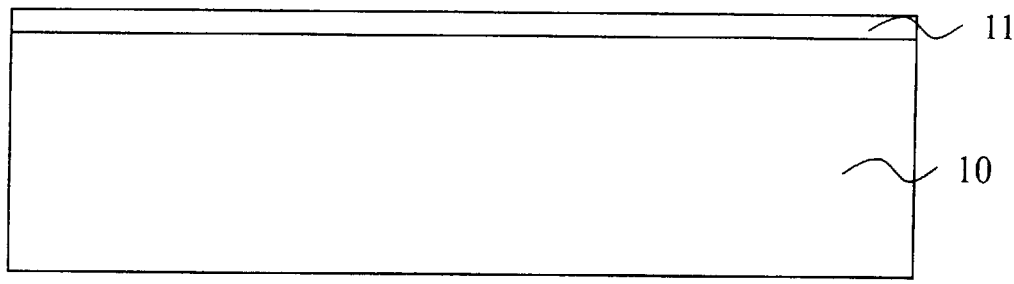
FIG. 1A is a schematic cross-sectional view showing an oxide film deposited on a substrate in accordance with one preferred embodiment of the present invention.
Figure 1B:
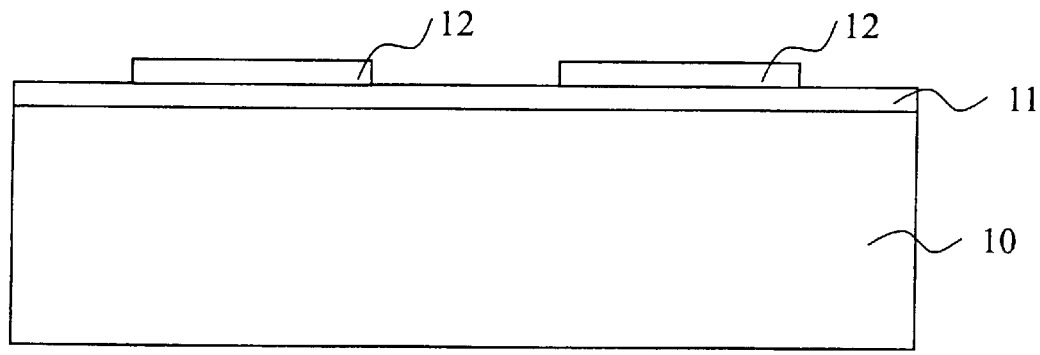
FIG. 1B is a schematic cross-sectional view showing a first metal film formed on the oxide film in accordance with one preferred embodiment of the present invention.

Please refer to FIG. 1A to FIG. 1F, which show a method for fabricating an n-type carbon nanotube device in accordance with one preferred embodiment of the present invention. As shown in FIG. 1A, an oxide film 11 of 1000 Å in thickness is deposited on a substrate 10. Then, a first metal film 12 is formed on the oxide film 11. In the present embodiment, the first metal film 12 is formed of Ti. The first metal film 12 is then patterned by photolithography as well as etching so as to function as a drain region and a source region, as shown in FIG. 1B.

Figure 1C:
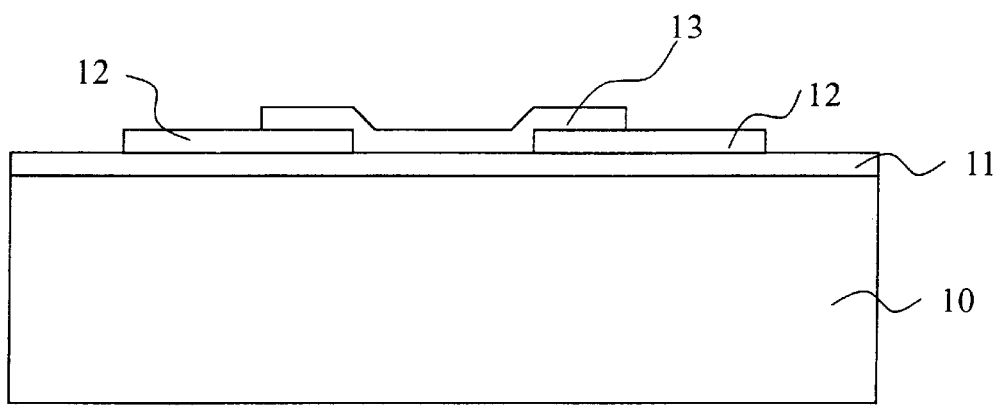
FIG. 1C is a schematic cross-sectional view showing a carbon nanotube layer formed on the first metal film in accordance with one preferred embodiment of the present invention.

As shown in FIG. 1C, a carbon nanotube layer 13 formed by spin-coating carbon nanotube dimethylformamide (CNT DMF) on the first metal film 12. The carbon nanotube layer 13 conducts the current between the drain and the source in a transistor.

Figure 1D:
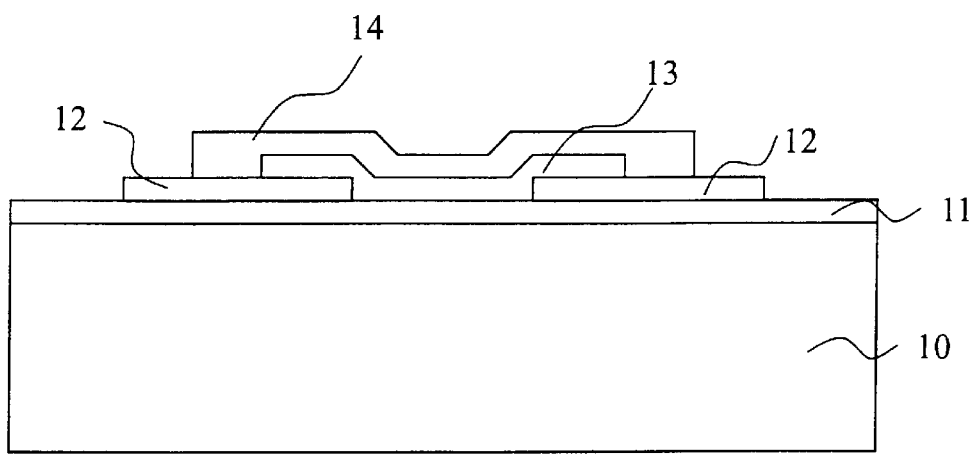
FIG. 1D is a schematic cross-sectional view showing a gate layer covering the first metal film and the carbon nanotube layer in accordance with one preferred embodiment of the present invention.
Figure 1E:
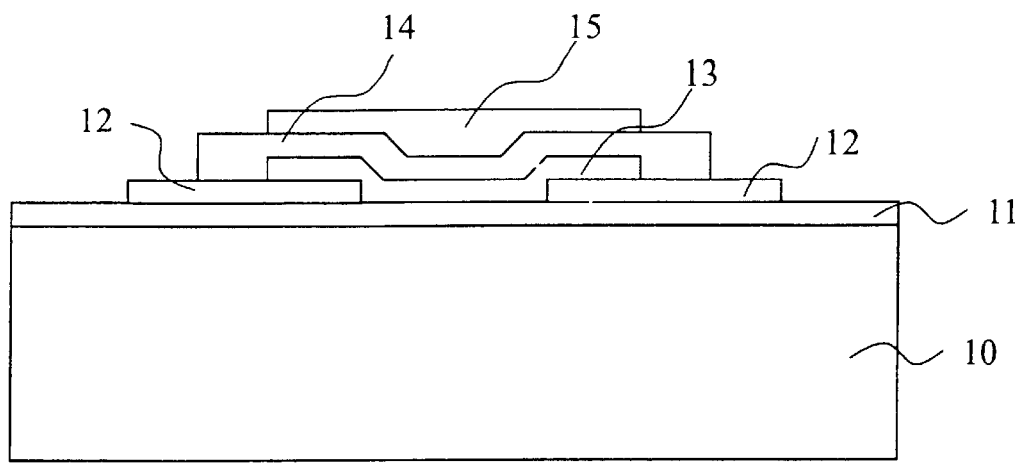
FIG. 1E is a schematic cross-sectional view showing a second metal film formed on the gate layer in accordance with one preferred embodiment of the present invention.

In FIG. 1D, a gate layer 14 is formed by plasma-enhanced chemical vapor-phased deposition (PECVD) and thermal annealing at 400° C. to cover the first metal film 12 and the carbon nanotube layer 13. The gate layer 14 is formed of a non-oxide material, such as silicon nitride (SiNx) in the present embodiment. By using the gate layer 14 as a gate oxide layer, the inherently p-type carbon nanotube device exhibits n-type characteristics. Later, as shown in FIG. 1E, a second metal film 15 of 1500 Å in thickness is deposited on the gate layer 14. In the present embodiment, the second metal film 15 is formed of Ti.

Figure 1F:
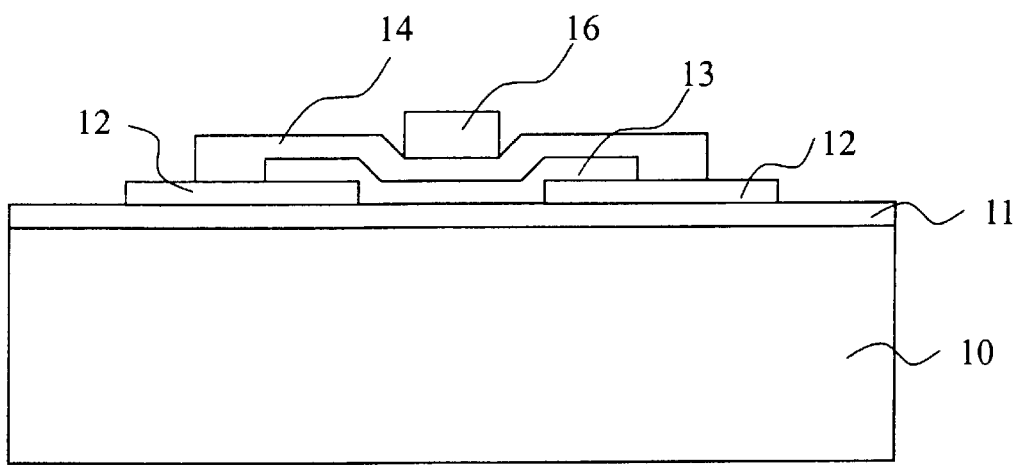
FIG. 1F is a schematic cross-sectional view showing a gate electrode formed on the gate layer in accordance with one preferred embodiment of the present invention.

Finally, the second metal film 15 is patterned to form a gate electrode 16 for an n-type carbon nanotube device by using conventional semiconductor manufacturing process such as photolithography and etching, as shown in FIG. 1F.

Figure 2A:
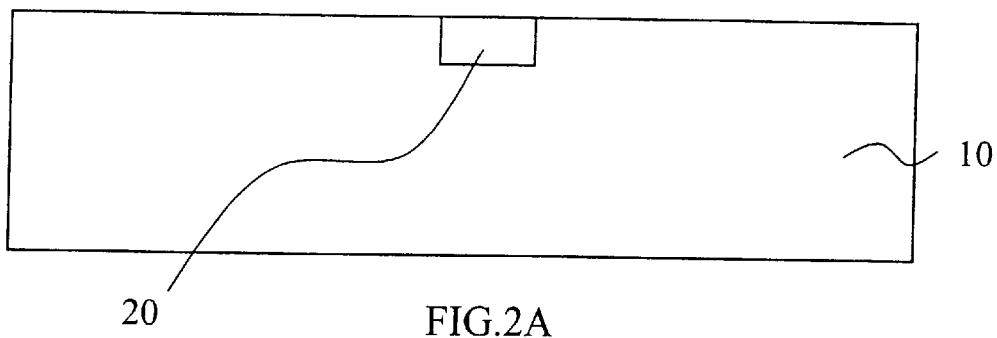
FIG. 2A is a schematic cross-sectional view showing a gate electrode formed in a substrate in accordance with another preferred embodiment of the present invention.
Figure 2B:
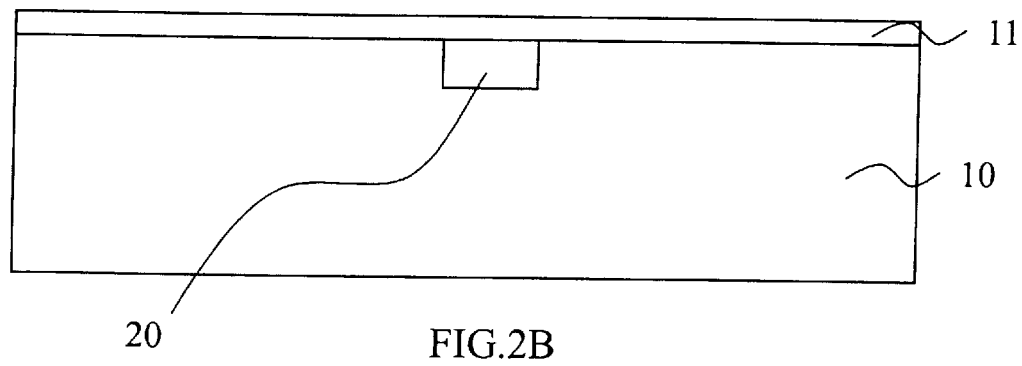
FIG. 2B is a schematic cross-sectional view showing an oxide film deposited on the substrate and the gate electrode in accordance with another preferred embodiment of the present invention.
Figure 2C:
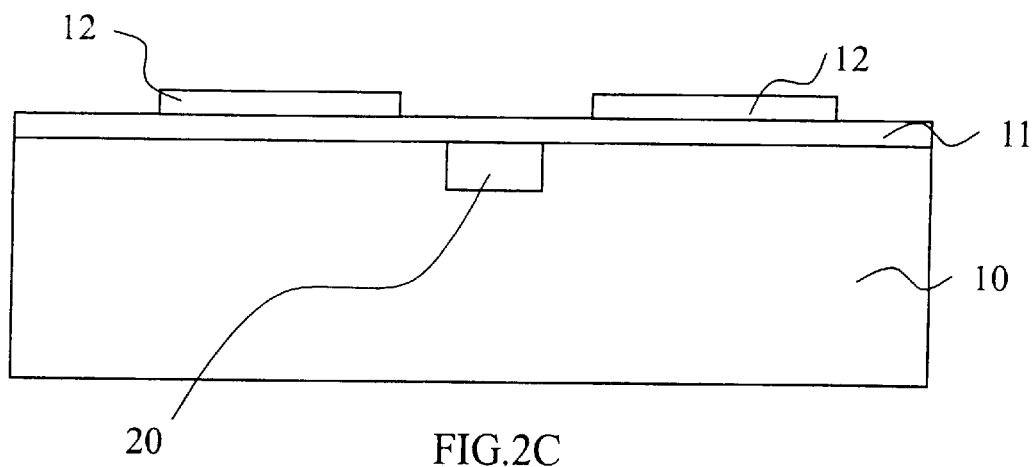
FIG. 2C a schematic cross-sectional view showing a first metal film covering the oxide film in accordance with another preferred embodiment of the present invention.

For another embodiment of the present invention, please refer to FIG. 2A to FIG. 2E, which show a method for fabricating an n-type carbon nanotube device. As shown in FIG. 2A, a substrate 10 is patterned by etching to form a pattern for the gate electrode and then a metal film is formed in the substrate 10 by sputtering so as to form a gate electrode 20. Later, as shown in FIG. 2B, an oxide film 11 of 1000 Å in thickness is deposited on the substrate 10 and the gate electrode 20. A first metal 12 is then sputtered onto the oxide film 11. In the present embodiment, the first metal is formed of Ti. The first metal film 12 is then patterned by photolithography as well as etching so as to function as a drain region and a source region, as shown in FIG. 2C.

Figure 2D:
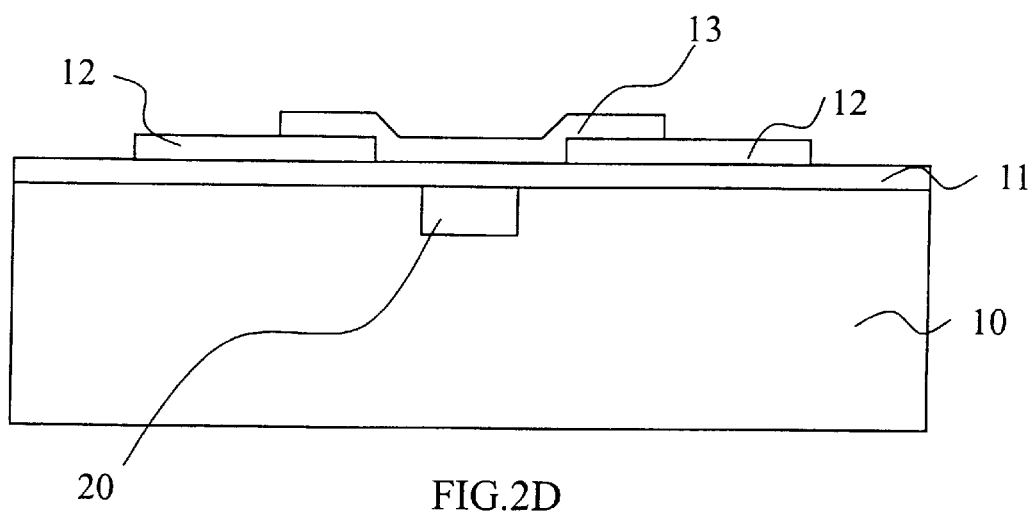
FIG. 2D a schematic cross-sectional view showing a carbon nanotube layer deposited on the first metal film in accordance with another preferred embodiment of the present invention.

In FIG. 2D, a carbon nanotube layer 13 formed by spin-coating carbon nanotube dimethylformamide (CNT DMF) on the first metal film 12. The carbon nanotube layer 13 conducts the current between the drain and the source in the n-type carbon nanotube device according to the present invention.

Figure 2E:
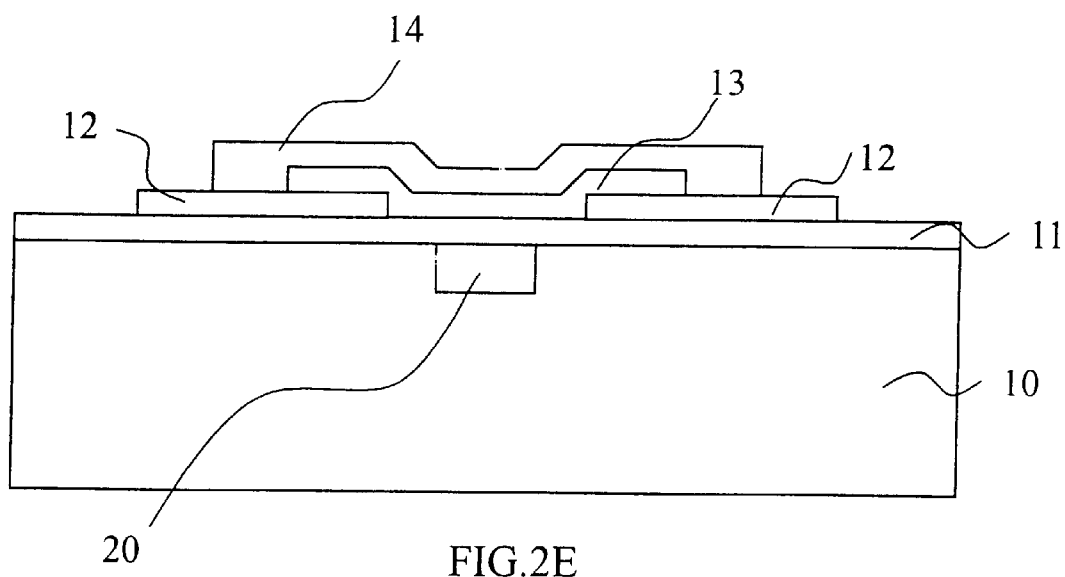
FIG. 2E a schematic cross-sectional view showing a gate layer covering the first metal film and the carbon nanotube layer in accordance with another preferred embodiment of the present invention.

Finally, as shown in FIG. 2E, a gate layer 14 is formed by plasma-enhanced chemical vapor-phased deposition (PECVD) and thermal annealing at 400° C. to cover the first metal film 12 and the carbon nanotube layer 13. The gate layer 14 is formed of a non-oxide material, such as silicon nitride (SiNx) in the present embodiment. By using the gate layer 14 as a gate oxide layer, the inherently p-type carbon nanotube device exhibits n-type characteristics.

According to the above discussion, it is apparent that the present invention discloses a method for fabricating an n-type carbon nanotube device, characterized in that thermal annealing and plasma-enhanced chemical vapor-phased deposition (PECVD) are employed to form a non-oxide gate layer on a carbon nanotube device. Therefore, the inherently p-type carbon nanotube can be used to fabricate an n-type carbon nanotube device with reliable device characteristics and high manufacturing compatibility. Therefore, the present invention has been examined to be progressive, advantageous and applicable to the industry.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for fabricating an n-type carbon nanotube device, comprising steps of:

forming a gate electrode in a substrate;

depositing an oxide film on said substrate and said gate electrode;

forming a first metal film on said oxide film;

depositing a carbon nanotube layer on said first metal film; and depositing a gate layer covering said first metal film and said carbon nanotube layer.

2. The method for fabricating an n-type carbon nanotube device as claimed in claim 1, wherein said gate electrode is formed by sputtering a metal film onto an etched substrate.

3. The method for fabricating an n-type carbon nanotube device as claimed in claim 1, wherein said first metal film is formed by sputtering and is patterned by etching.

4. The method for fabricating an n-type carbon nanotube device as claimed in claim 1, wherein said carbon nanotube layer is formed by spin-coating carbon nanotube dimethylformamide (CNT DMF) on said first metal film.

5. The method for fabricating an n-type carbon nanotube device as claimed in claim 1, wherein said gate layer is formed of a non-oxide material.

6. The method for fabricating an n-type carbon nanotube device as claimed in claim 1, wherein said gate layer is formed by using plasma-enhanced chemical vapor-phased deposition (PECVD) and vacuum-annealing.

* * * * *